United States Patent
Farmer et al.

(10) Patent No.: US 7,548,174 B2
(45) Date of Patent: Jun. 16, 2009

(54) SYSTEM AND METHOD FOR EQUALIZING TRANSITION DENSITY IN AN INTEGRATED CIRCUIT

(75) Inventors: Michael Martin Farmer, Fort Collins, CO (US); Robert J. Martin, Timnath, CO (US); Peter Meier, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/867,238

(22) Filed: Oct. 4, 2007

(65) Prior Publication Data

US 2009/0091369 A1  Apr. 9, 2009

(51) Int. Cl.
*H03M 7/00* (2006.01)

(52) U.S. Cl. .......................................... 341/50; 326/26

(58) Field of Classification Search ................... 341/50; 326/26–28
See application file for complete search history.

(56) References Cited

U.S. PATENT DOCUMENTS

| 7,332,930 | B2 * | 2/2008 | Mitsuishi | 326/21 |
| 2005/0242841 | A1 * | 11/2005 | Mitsuishi | 326/93 |

FOREIGN PATENT DOCUMENTS

JP  04358852 A  * 12/1992

* cited by examiner

*Primary Examiner*—Howard Williams (57) ABSTRACT

A system for equalizing transition density in an integrated circuit includes a first circuit configured to transition according to a data stream; and a second circuit configured to transition at a time when the first circuit is not transitioning.

16 Claims, 7 Drawing Sheets

SYSTEM AND METHOD FOR EQUALIZING TRANSITION DENSITY IN AN INTEGRATED CIRCUIT

BACKGROUND

Power supply noise is one of the most critical design challenges with high speed integrated circuits, and high speed interfaces in particular. In addition, there are numerous other circuits that are sensitive to power supply noise. These include sensitive analog circuits and delay paths, such as clock distribution circuits. Power supply noise affects these circuits in various ways; however, a critical problem is noise-induced jitter on clock signals and delay paths. For high speed interfaces, jitter reduces the effective window for capturing data, resulting in lower performance or higher error rates.

Previous attempts to solve this problem include the use of bypass capacitance. However, for many high speed circuits, adding bypass capacitance has limited usefulness because the amount of bypass capacitance that can be added to a modern circuit is limited because it consumes valuable area on a chip, thus increasing cost. Further, adding additional capacitance to the device package or board has limited effect because the inductance of the package and interconnect limits the effective frequency range that can be compensated by adding bypass capacitance. For modern packaging technology, the ability to filter out noise with on-package or on-board capacitors is limited to a few hundred megahertz. Unfortunately, high speed circuits are sensitive to the effects of noise up to multiple gigahertz. For circuits that are operating at very high frequencies, such as 6 Gigahertz (Ghz) or higher, they can easily create noise at sub-multiples of these frequencies. One of the major contributors to this noise is switching currents. Every time a gate or driver circuitry changes state, there is additional current flow due to charging/discharging capacitors as well as shoot-through currents caused by pullup and pulldown transistors being on at the same time. Noise on the power supplies can be caused by variations in this switching current, especially when the data has a series of transitions, followed by a series of data with few or no transitions. In such an instance, the current demanded by the circuits changes. This change in current can have frequency components that cannot be properly filtered out. In high-speed serial circuits, much of this current is dominated by the driver and related circuitry.

Another approach is to design circuitry that is insensitive, or more resistant to the negative effects of noise. Such circuits tend to be complex and with newer process generations, tend to be very sensitive to inherent process variations, in many cases causing more problems than they solve.

Another approach is for high-speed interfaces to use constant current drivers. Unfortunately, such constant current drivers consume a large amount of power and area on a semiconductor die.

Therefore, it would be desirable to have a way to shift the frequency of the problematic power supply noise in an integrated circuit.

SUMMARY

In an embodiment, a system for equalizing transition density in an integrated circuit includes a first circuit configured to transition according to a data stream; and a second circuit configured to transition at a time when the first circuit is not transitioning.

Related embodiments and methods of operation are also provided. Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of the system and method for equalizing transition density in an integrated circuit to be described below will be described in the context of an integrated circuit, or a number of integrated circuit portions formed on a single die, also referred to as a "chip." However, the system and method for equalizing transition density in an integrated circuit can be implemented in any circuitry in which it is desirable to reduce power supply noise induced by irregular data transitions.

Figure 1:
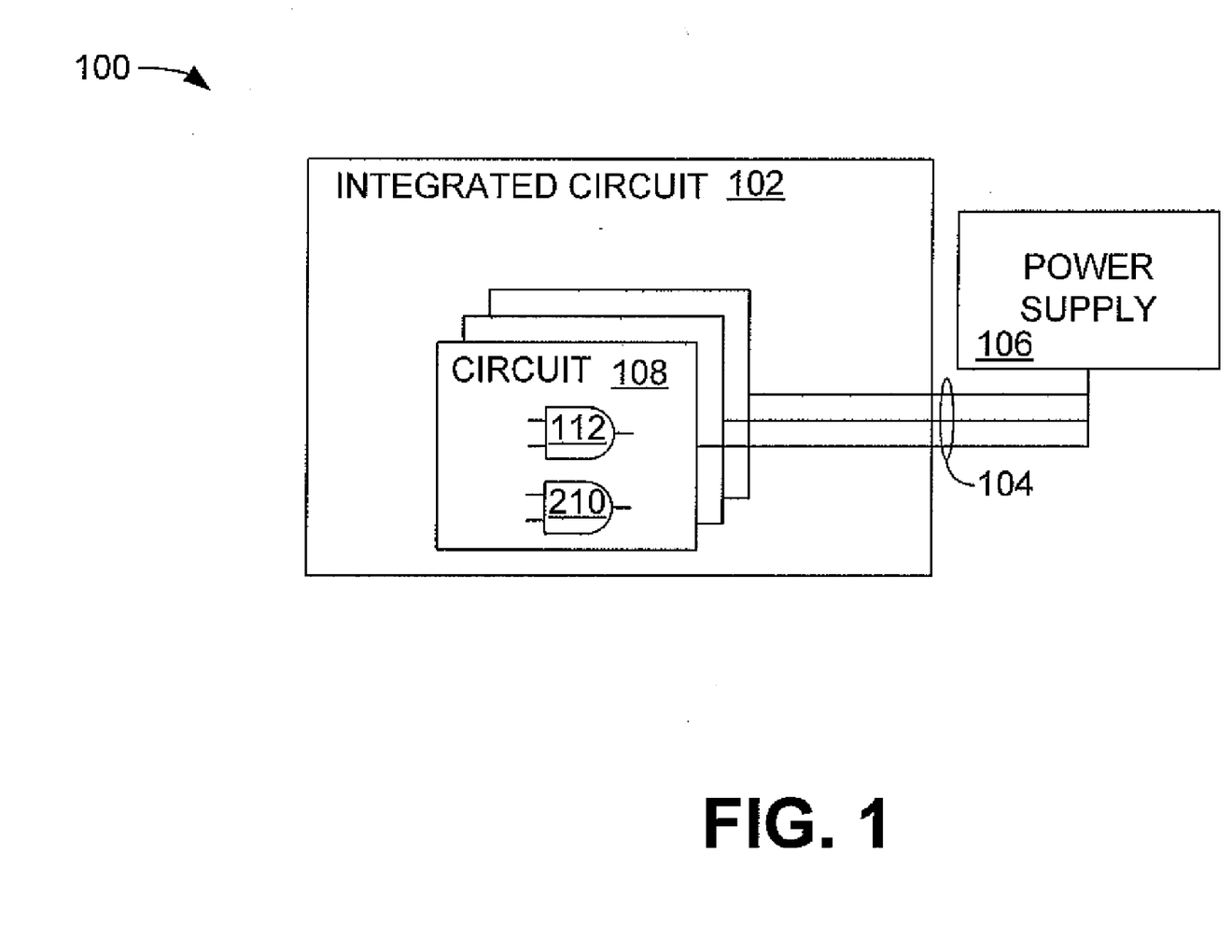
FIG. 1 is a block diagram illustrating an embodiment of a system for equalizing transition density in an integrated circuit.

FIG. 1 is a block diagram illustrating an embodiment of the system 100 for equalizing transition density in an integrated circuit. An integrated circuit 102 is connected to a power supply 106 via connection 104. In the example shown in FIG. 1, there are multiple circuits 108 on the integrated circuit 102. The circuits 108 may be multiple iterations of the same circuit, or may be different circuits. Each of the circuits 108 are coupled via a separate power supply connection 104 to the power supply 106. In an embodiment, each circuit 108 includes logic 112 and an additional transition circuit 210. In an embodiment, the additional transition circuit 210 includes a replica of the logic 112 and a decision circuit, to be described below. However, the additional transition circuit 210 can include circuitry that is different from the logic 112.

Figure 2:
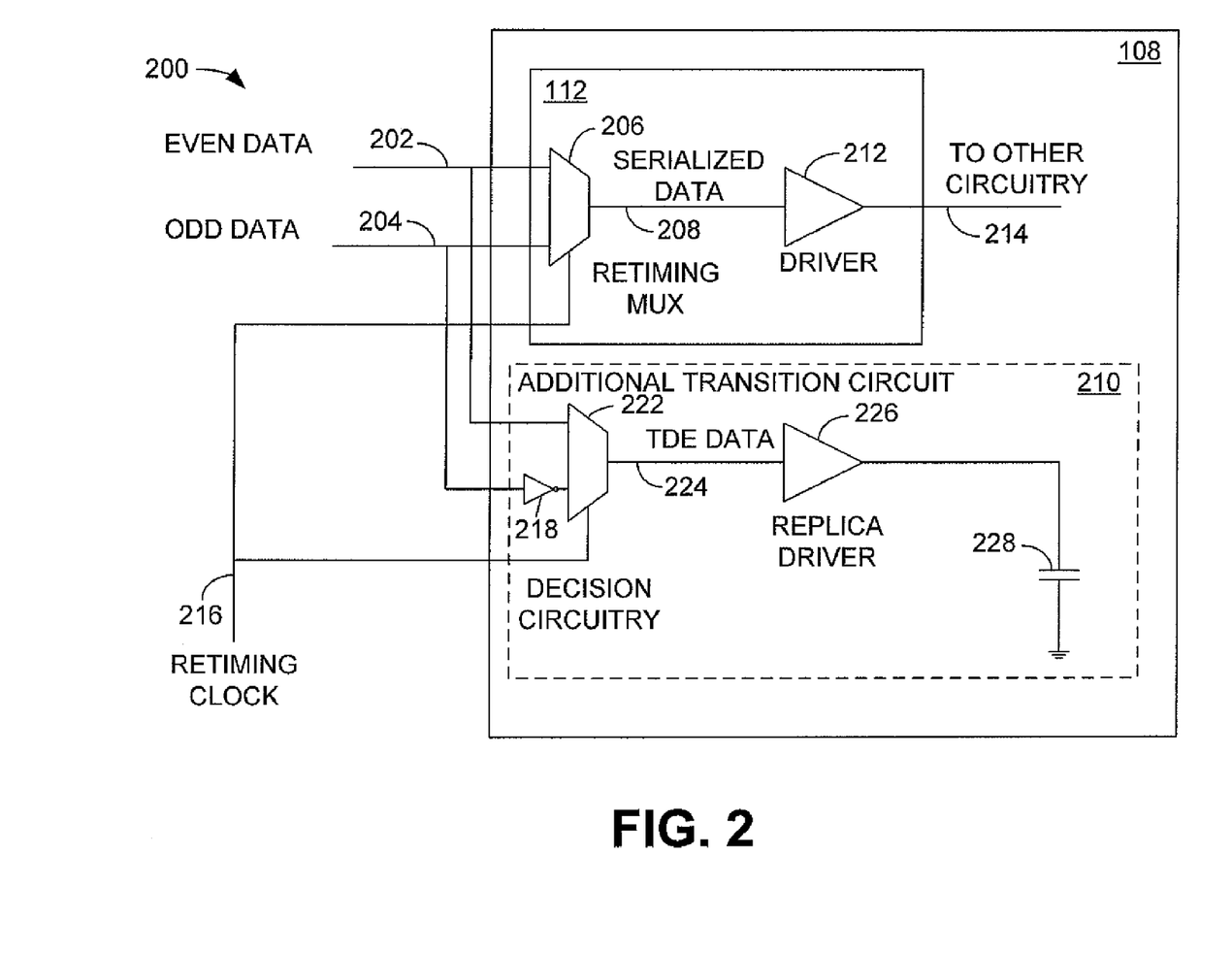
FIG. 2 is a schematic diagram illustrating an embodiment of the system for equalizing transition density of FIG. 1.

FIG. 2 is a schematic diagram 200 illustrating an embodiment of the system for equalizing transition density of FIG. 1. The logic 112 includes a driver 212 that receives serialized data via connection 208 from a multiplexer 206. The multiplexer 206 receives the original data over connections 202 and 204. The multiplexer is referred to as a "retiming multiplexer," as will be described below. In this example even data is supplied via connection 202 and odd data is supplied via connection 204. The driver 212 represents the logic, or circuitry on an integrated circuit, the transitions of which are sought to be equalized, and is shown as a single element for simplicity of description. Further, circuit elements other than a single driver will typically comprise the circuit.

The additional transition circuit 210 includes replica circuitry, which in this example is shown as a replica driver 226, and decision circuitry 222. In this example, the replica driver 226 is a replica of the driver 212. However, any circuitry can be replicated. The replica driver 226 mimics the current draw of the driver 212, which in this example is the primary circuit the transitions of which are sought to be equalized. However, other circuitry can be implemented. The replica circuitry need not be an exact duplicate of the circuitry the transitions of which are sought to be equalized. For example, in an embodiment, whatever circuitry is located in logic 112 would be duplicated in the additional transition circuit 210. In an alternative embodiment, different circuitry will be implemented in the additional transition circuit. However, implementing circuitry in the additional transition circuit that is substantially the same as the circuitry in the circuit 108 has advantages, such as providing a substantial match regarding electrical performance parameters.

The additional transition circuit 210 also includes decision circuitry 222. The decision circuitry 222 receives the original even data via connection 202 and receives an inverted version of the original odd data via connection 204 and inverter 218. However, the even data may be inverted instead of the odd data. As will be described below, the decision circuitry 222 determines when to cause the replica driver 226 to transition. In an embodiment, the decision circuitry can be implemented using a multiplexer. Causing the replica driver 226 to transition at a time other than when the driver 212 transitions equalizes the transitions in the circuit 108, thus reducing noise induced by the power supply.

Further, this causes the replica driver 226 to draw current from the power supply (FIG. 1) only when the driver 212 is not drawing current from the power supply (FIG. 1). This arrangement evens the current draw from the power supply and shifts the frequency of any undesirable power supply noise in the integrated circuit to a frequency that minimizes any negative effect on the integrated circuit.

The decision circuitry 222 is likely to be similar to circuitry existing on the logic 112. The decision circuitry 222 monitors the data being sent to the logic 112, and determines when there are periods of time during which there are no data transitions in an original serial data stream. Said another way, the decision circuitry 222 determines when a data transition should occur to equalize the load on the power supply. During these periods of no, or missing, data transitions, the decision circuitry 222 can cause the replica driver 226 to transition. The exact algorithm could vary from exactly matching each missing transition with an additional transition, to one which only adds in a fraction of the additional transitions. For high speed driver circuits that use de-emphasis to reduce the currents in certain situations, using fewer transitions might be a more effective match than using every transition. Alternately, turning on less replica circuitry could yield similar effects.

A re timing clock signal is supplied via connection at 216 to the multiplexer 206 and to the decision circuitry 222. The retiming clock signal is a periodic clock signal that drives the multiplexer 206 and the decision circuitry 222.

Figure 3:
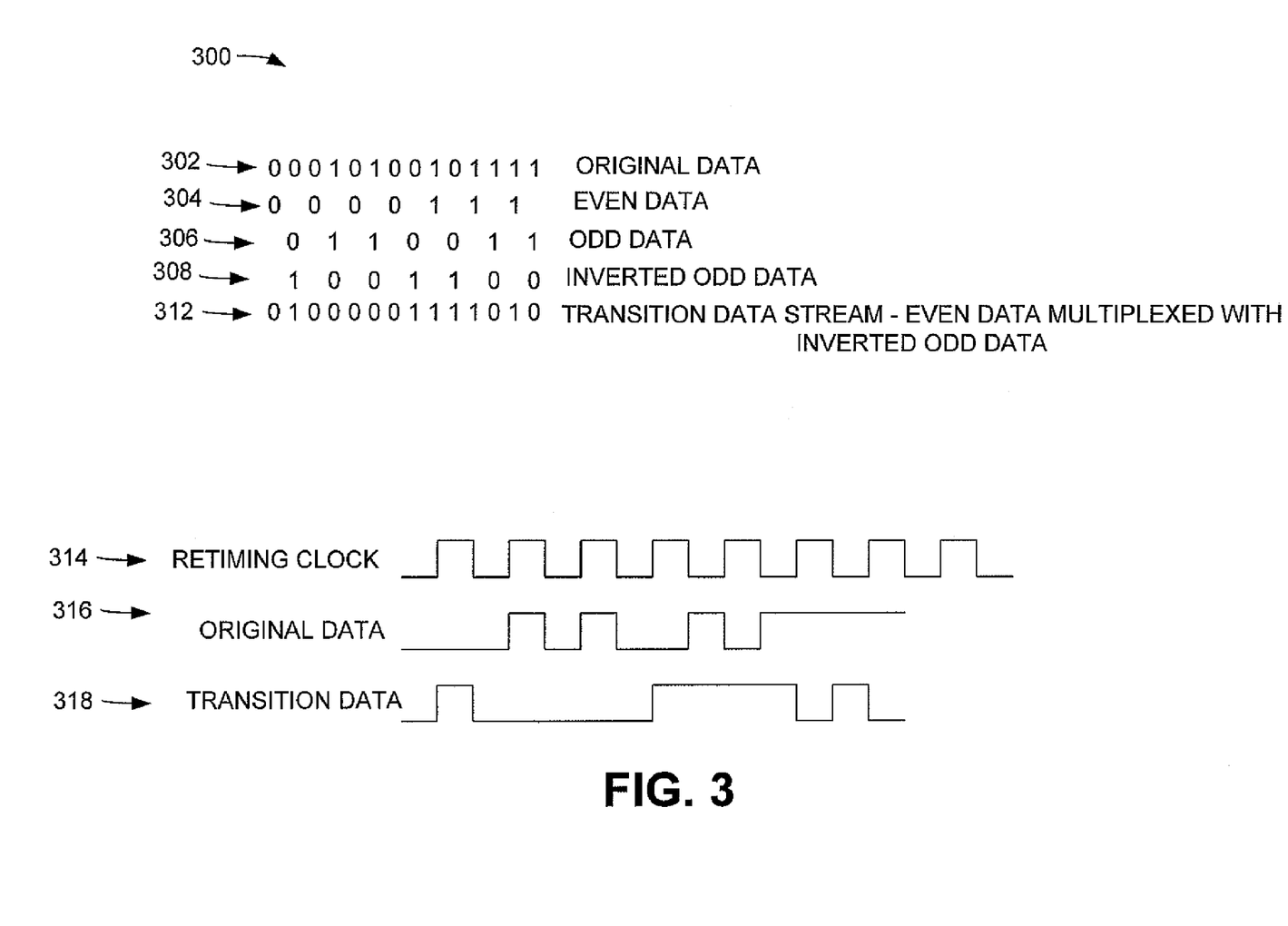
FIG. 3 is a timing diagram illustrating an example of the operation of the system for equalizing transition density of FIG. 2.

FIG. 3 is a timing diagram illustrating an example of the operation of the system for equalizing transition density of FIG. 2. The timing diagram 300 includes an example of an original data stream 302, which is parsed into even data 304 and odd data 306. The terms "even data" and "odd data" referred to the position of the bits of the original data stream 302. Referring momentarily to FIG. 2, in this example, the inverter 218 inverts the odd data to provide the inverted odd data stream 308. However, alternatively, the even data may be inverted. The transition data stream including the even data 304 and the inverted odd data 308 is shown at 312. The transition data stream is provided by the decision circuitry 222 (e.g., a multiplexer) to the replica driver 226 via connection 224. The transition data stream is also referred to as the transition data equalizer (TDE) data stream.

The re-timing clock signal (216 of FIG. 2) is shown at 314, the original data stream 302 is graphically represented with data stream 316 and the transition data stream 312 is graphically represented with transition data stream 318. The transition data stream 318 is a multiplexed data stream comprising the even data stream 304 and the inverted odd data stream 308. When compared against the original data stream 302, the transition data stream 312 provides additional data transitions using the decision circuitry 222 and the replica driver 226 in order to equalize the data transitions in the circuit 108.

The transition data stream 318 ensures that there are sufficient data transitions on the circuit 108 so that when the normal transmitter or noise aggressor is not active, the frequency content of the power supply noise is moved into a frequency closer to or at the data rate. This frequency translation has multiple advantages.

Lower frequencies will cause the voltage across a given amount of capacitance to vary more for the same energy. This reduces the noise suppression effect of a limited amount of bypass capacitance. Therefore, the elimination of the low frequency content decreases the amplitude of the supply noise.

Voltage variation on the supply increases or decreases the propagation delay of complementary metal oxide semiconductor (CMOS) clock paths depending on the instantaneous polarity of the noise. Therefore, clock distributions tend to translate the voltage variations or supply noise into phase error or jitter, and each additional stage of clock distribution should increase the jitter given the same amount of noise. However, as the frequency of noise increases, voltage variations that would increase the propagation delay tend to occur during the same period as variations that would tend to decrease the propagation delay. Thus the average delay through a clock chain appears constant, reducing the jitter in the system.

Figure 4:
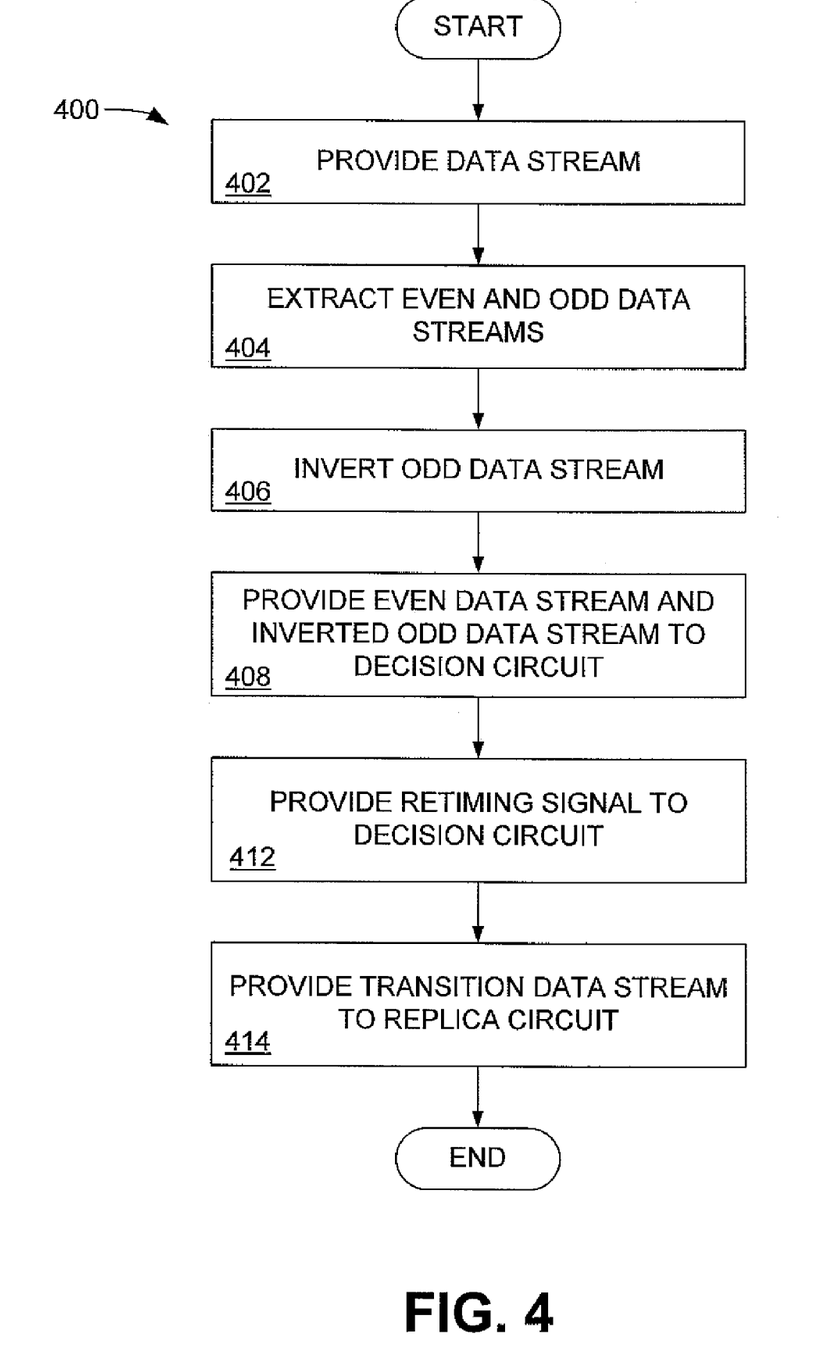
FIG. 4 is a flowchart showing the operation of an embodiment of the system for equalizing transition density of FIG. 2.

FIG. 4 is a flowchart showing the operation of an embodiment of the system for equalizing transition density of FIG. 2.

In block 402 an original data stream is provided to the decision circuitry 222. In block 404 the even and odd data streams are extracted and supplied via connections 202 and 204, respectively, to the decision circuitry 222. In block 406 the odd data stream is inverted by the inverter 218. In block 408, the even data stream and the inverted odd data stream are provided to the decision circuitry 222. In block 412, are timing clock signal is provided via connection 216 to the decision circuitry 222. In block 414, the decision circuitry serializes the data substantially simultaneously with the multiplexer 206, and provides a transition data stream, including the even data stream and the inverted odd data stream via connection 224 to a replica driver 226. The transition data stream causes the replica driver 226 to transition under the command of the decision circuitry 222.

Figure 5:
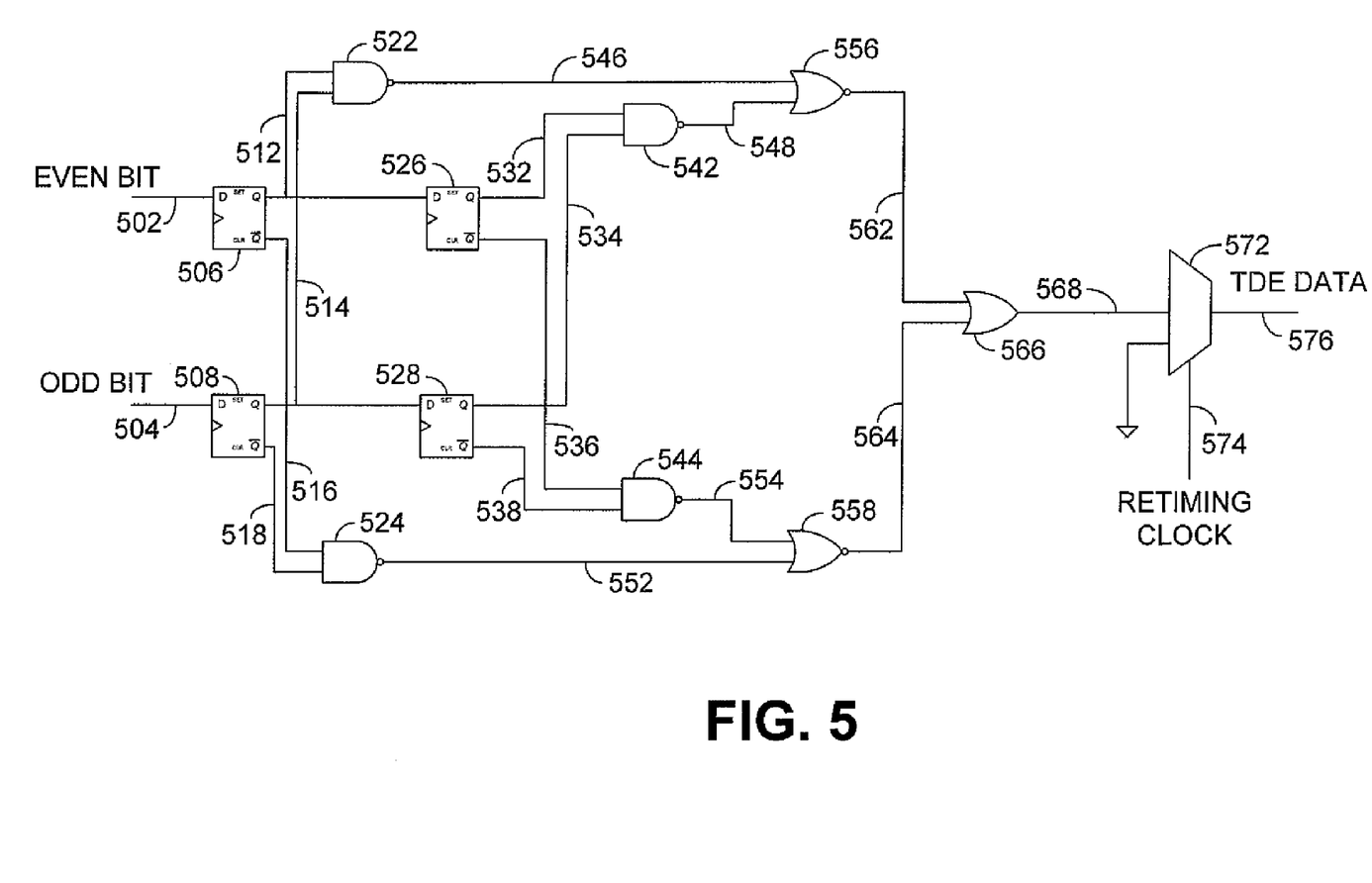
FIG. 5 is a schematic diagram illustrating an alternative implementation of the additional transition circuit of FIG. 2.

FIG. 5 is a schematic diagram illustrating an alternative implementation of the additional transition circuit of FIG. 2. In this embodiment, the circuit 500 analyzes four (4) bits of information simultaneously to determine whether the state of the 4 bits is either all logic 0 or all logic 1. If the state of all of the bits is logic one or the state of all of the bits is logic zero, the output of the circuit 500 will transition high during the high phase of the retiming clock cycle. During the low phase of the retiming clock cycle the output of the circuit 500 will transition back to low. The result is that pulses are inserted into the data stream wherever there are 4 or more bits having the same logic value.

The circuit 500 of FIG. 5 includes a logic element, implemented as a flip flop 506 configured to receive an even bit supplied via connection 502 and a flip flop 508 configured to receive an odd bit supplied via connection 504. The flip flop 506 provides the even bit on connection 512 and an inverted version of the even bit on connection 516. The flip flop 508 provides the odd bit on connection 514 and an inverted version of the odd bit on connection 518. The output of the flip flops 506 and 508 are supplied to logic elements 522 and 524. The logic elements 522 and 524 perform the NAND function. The non-inverted outputs of the logic elements 506 and 508 are also supplied to flip flops 526 and 528.

The flip flop 526 provides the even bit on connection 532 and an inverted version of the even bit on connection 536. The flip flop 528 provides the odd bit on connection 534 and an inverted version of the odd bit on connection 538. The outputs of the flip flops 526 and 528 are supplied to the logic gates at 542 and 544. The logic gates 542 and 544 perform the NAND function. The output of the logic gate 522 and the output of the logic gate 542 are supplied to logic gate 556. The output of the logic element 544 and the output of the logic element of 524 are supplied to the logic element 558. The logic elements 556 and 558 perform the NOR function. The output of the logic element 556 is a data stream containing all ones on connection 562 and the output of the logic element 558 is a data stream containing all zeros on connection 564.

The data stream of all ones on connection 562 and the data stream of all zeros on connection 564 are supplied as inputs to the logic element 566. The logic element 566 performs the OR function. The output of the logic element 566 on connection 568 is supplied as the input to the decision circuitry 572. The decision circuitry 572 is similar in operation to the decision circuitry 222 shown in FIG. 2. The retiming clock signal is supplied to the decision circuitry 572 via connection 574 in a similar manner to the retiming clock signal on connection 216 described above.

If the state of all of the bits is logic one or the state of all of the bits is logic zero, the output of the circuit 500 will transition high during the high phase of the retiming clock cycle. During the low phase of the retiming clock cycle the output of the circuit 500 will transition back to low. The result is that pulses are inserted wherever there are 4 or more bits having the same logic value. The output of the decision circuitry 572 on connection 576 is the transition data stream. In this embodiment, the transition data stream of FIG. 5 is created simultaneous to the serialization of the data.

Figure 6:
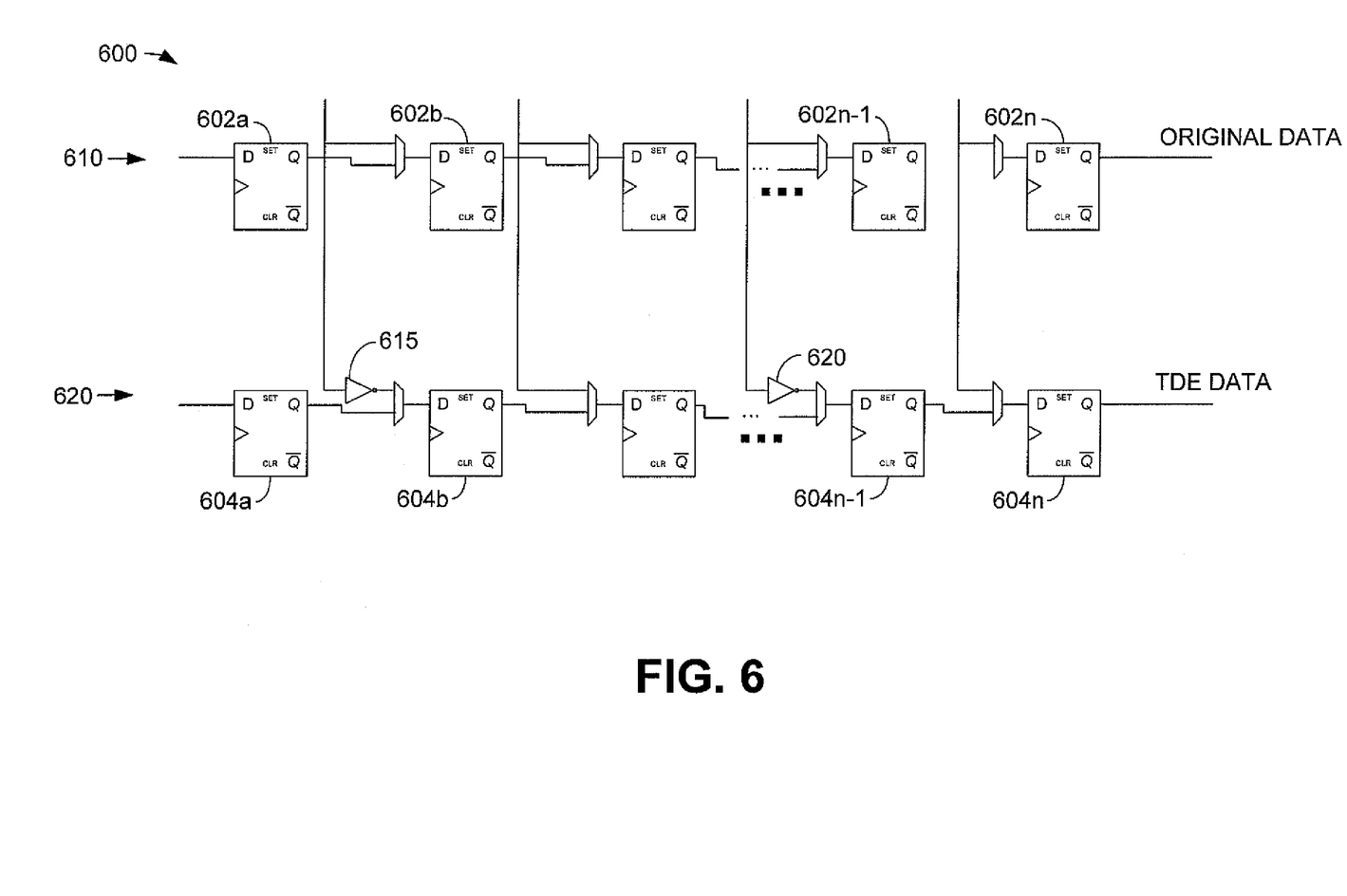
FIG. 6 is a schematic diagram illustrating an alternative implementation of the additional transition circuit of FIG. 2.

FIG. 6 is a schematic diagram illustrating an alternative implementation of the additional transition circuit of FIG. 2. The additional transition circuit 600 comprises a first shift register 610 and a second shift register 620. The first shift register 610 includes a plurality of flip-flops, referred to as 602a through 602n. Similarly, the second shift register 620 includes a plurality of flip-flops, referred to as 604a through 604n. The actual number of flip-flops in each of the shift registers depends upon the actual implementation. In accordance with this embodiment, every other shift register 604 in the second shift register 620 includes an inverter. For example, the inverter 615 is located prior to the flip-flop 604b and the inverter 620 is located prior to the flip-flop 604n-1. The inverters 615 and 620 invert every other bit in the second shift register to develop the transition data stream. In this example, the first shift register 610 provides the original serial data stream while the second shift register 620 provides the transition data stream. In this example, the circuit 600 provides the transition data stream as part of the data serialization process.

Figure 7A:
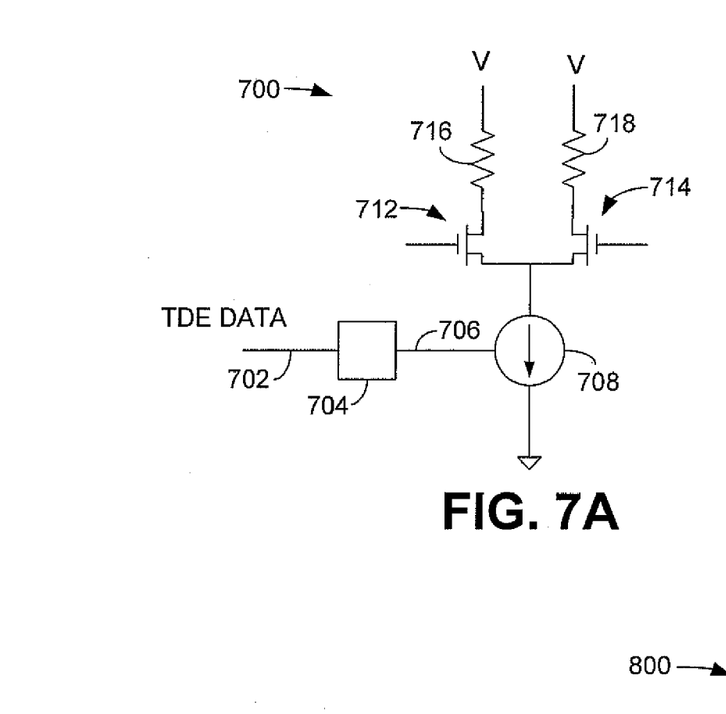
FIG. 7A is a schematic diagram illustrating the use of the transition data stream to switch a current source.

FIG. 7A is a schematic diagram illustrating the use of the transition data stream to modulate a current source. In this example, the transition data stream is supplied via connection 702 to a circuit element 704. The circuit element 704 can be, for example, a mixer and or an amplifier. The circuit element 704 is coupled to a current source 708 via connection 706. The current source 708 is also coupled to a voltage source via transistors 712 and 714; and resistors 716 and 718. In this example, the transition data stream on connection 702 is used to modulate the current at the current source 708.

Figure 7B:
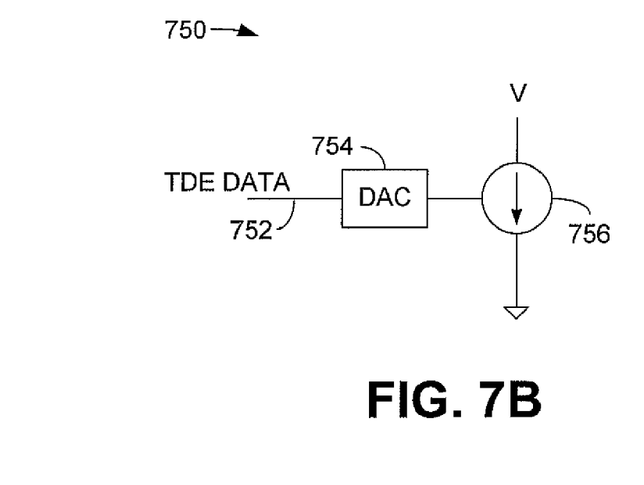
FIG. 7B is a schematic diagram illustrating another example of using the transition data stream to switch a current source.

FIG. 7B is a schematic diagram illustrating another example of using the transition data stream to modulate a current source directly connected to supply and ground. In this example, the transition data stream is supplied to a digital-to-analog converter (DAC) 754 via connection 752. The output of the DAC 754 is used to switch, or modulate, the current source 756.

Figure 8:
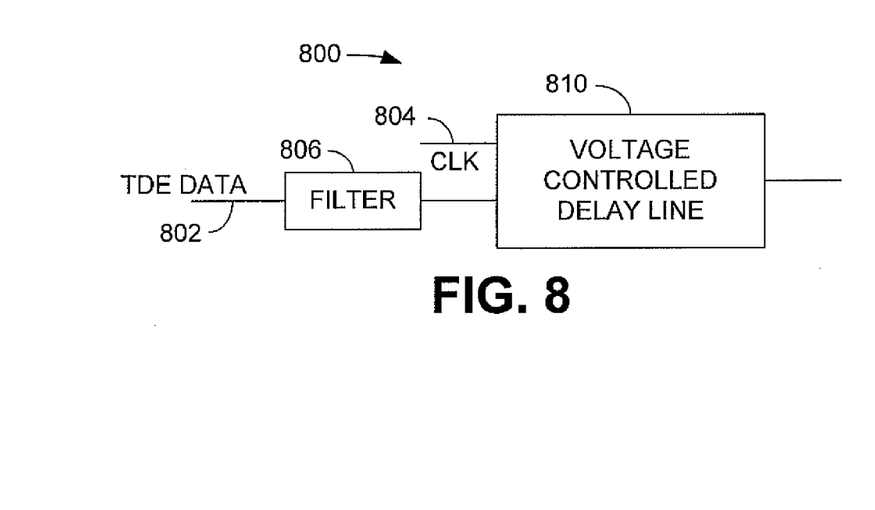
FIG. 8 is a schematic diagram illustrating the use of the transition data stream to cancel jitter on a voltage controlled delay line.

FIG. 8 is a schematic diagram illustrating the use of the transition data stream to cancel jitter on a voltage controlled delay line. The transition data stream is supplied via connection 802 to a filter 806. The output of the filter 806 and a clock signal on connection 804 are supplied to a voltage controlled delay line 810. The transition data stream on connection 802 helps to cancel jitter in the voltage controlled delay line 810.

The embodiments of the additional transition circuit described above determine data pattern transition density and uses the pattern density information to create a transition data stream. The transition data stream can be used to shape, modulate, reduce or translate frequency content or noise content of any signal or circuit node by modulating the current or the voltage.

The transition data stream can also be used to shape, modulate, reduce or translate jitter or phase noise of any signal or circuit node by modulating the current or the voltage. The transition data stream can also be used to shape, modulate, reduce or translate frequency content of circuit power by modulating currents and or voltages. The transition data stream can also be used to condition circuit power by modulating currents or voltages, thereby reducing jitter or phase noise. The embodiments of the additional transition circuit described above also determine whether two or more serial bits are equivalent, and whether two or more serial bits are equivalent and cause another circuit to change state.

This disclosure describes the invention in detail using illustrative embodiments. However, it is to be understood that the invention defined by the appended claims is not limited to the precise embodiments described.

What is claimed is:

1. A system for equalizing transition density in an integrated circuit, comprising:
   a first circuit coupled to a power supply and configured to transition according to first and second instances of a data stream;
   a second circuit coupled to the power supply, the second circuit substantially similar to the first circuit, the second circuit configured to transition at a time when the first circuit is not transitioning; and a decision circuit coupled to the second circuit, the decision circuit configured to receive the first instance of the data stream and the second instance of the data stream, wherein at least one of the first and second instances of the data stream is inverted, the decision circuit configured to provide a transition data stream that is a combination of the first instance of the data stream and the second instance of the data stream.

2. The system of claim 1, in which the first instance of the data stream is inverted.

3. The system of claim 1, in which the second instance of the data stream is inverted.

4. The system of claim 1, in which the first circuit comprises a first shift register and a second shift register, in which every other bit in the second shift register is inverted.

5. The system of claim 4, in which an output of the second shift register is a transition data stream that causes the second circuit to transition at a time when the first circuit is not transitioning.

6. A method for equalizing transition density in an integrated circuit, comprising:

providing first and second instances of a data stream to a first circuit;

causing the first circuit to transition according to the data stream;

providing the first instance of the data stream and the second instance of the data stream to a decision circuit, wherein at least one of the first and second data stream is inverted;

providing a transition data stream that is a combination of the first instance of the data stream and the second instance of the data stream; and causing a second circuit to transition according to the transition data stream, wherein the second circuit transitions at a time when the first circuit is not transitioning.

7. The method of claim 6, in which the first instance of the data stream is inverted.

8. The method of claim 6, in which the second instance of the data stream is inverted.

9. The method of claim 6, in which the first circuit comprises a first shift register and a second shift register in which every other bit in the second shift register is inverted.

10. The method of claim 9, in which an output of the second shift register is a transition data stream that causes the second circuit to transition at a time when the first circuit is not transitioning.

11. An integrated circuit, comprising:

a plurality of circuits in which a first circuit is coupled to a power supply and configured to receive first and second instances of a data stream;

a second circuit coupled to the power supply, the second circuit substantially similar to the first circuit; and a decision circuit coupled to the second circuit, the decision circuit configured to receive the first instance of the data stream and the second instance of the data stream, wherein at least one of the first and second instances of the data stream is inverted, the decision circuit configured to provide a transition data stream that is a combination of the first instance of the data stream and the second instance of the data stream.

12. The integrated circuit of claim 11, in which the transition data stream causes the second circuit to transition at a time when the first circuit is not transitioning.

13. The integrated circuit of claim 11, in which the first instance of the data stream is inverted.

14. The integrated circuit of claim 11, in which the second instance of the data stream is inverted.

15. A system for equalizing transition density in an integrated circuit, comprising:

a first circuit coupled to a power supply and configured to draw current from the power supply according to first and second instances of a data stream;

a second circuit substantially similar to the first circuit, the second circuit coupled to the power supply and configured to draw current from the power supply at a time when the first circuit is not drawing current from the power supply; and a decision circuit coupled to the second circuit, the decision circuit configured to receive the first instance of the data stream and the second instance of the data stream, wherein at least one of the first and second instances of the data stream is inverted, the decision circuit configured to provide a transition data stream that is a combination of the first instance of the data stream and the second instance of the data stream.

16. The system of claim 15 in which:

the first circuit comprises a first shift register and a second shift register, in which every other bit in the second shift register is inverted.

\* \* \* \* \*